United States Patent [19]
Ham

[11] Patent Number: 5,556,725
[45] Date of Patent: Sep. 17, 1996

[54] METHOD FOR FABRICATING A HALF-TONE TYPE PHASE SHIFT MASK

[75] Inventor: Young M. Ham, Kyoungki-do, Rep. of Korea

[73] Assignee: Hyundai Electronics Industries Co., Ltd., Rep. of Korea

[21] Appl. No.: 365,909

[22] Filed: Dec. 29, 1994

[30] Foreign Application Priority Data

Dec. 31, 1993 [KR] Rep. of Korea ................. 1993-31845

[51] Int. Cl.$^6$ ........................................... G03F 9/00
[52] U.S. Cl. .............................. 430/5; 430/322; 430/324; 430/329; 430/394
[58] Field of Search ............................ 430/5, 322, 324, 430/329, 394

[56] References Cited

U.S. PATENT DOCUMENTS

| | | | |
|---|---|---|---|
| 5,130,263 | 7/1992 | Possin et al. | 437/40 |
| 5,276,551 | 1/1994 | Nakagawa | 359/565 |
| 5,300,378 | 4/1994 | Minami | 430/5 |
| 5,380,609 | 1/1995 | Fujita et al. | 430/5 |
| 5,409,789 | 4/1995 | Ito | 430/5 |

*Primary Examiner*—S. Rosasco
*Attorney, Agent, or Firm*—Merchant, Gould, Smith, Edell, Welter & Schmidt

[57] ABSTRACT

A method is disclosed for the fabrication of a phase shift mask comprising the steps of: forming chrome patterns on a transparent substrate; coating a phase shift layer and a negative photosensitive film on the entire area of the resulting structure, in sequence; exposing the photosensitive film to a light incident from the backside of the transparent substrate with the chrome patterns serving as a mask and developing the illuminated area of the photosensitive film, to form photosensitive film patterns; etching the phase shift layer to form phase shift patterns which are each positioned between the chrome patterns, with the photosensitive film patterns serving as a mask; subjecting the chrome patterns to wet etching, to conduct etching at the upper surface and the opposite edges of the chrome patterns so that each of the chrome patterns are spaced from each of the phase shift patterns; and removing the photosensitive film patterns with the transparent substrate exposed through the spaces between the etched chrome patterns and the phase shift patterns. The present method is advantageous in that a conventional chrome mask is utilized, so that particular equipments and additional designing are not necessary while the production cost thereof is reduced. In addition, the method is superior to conventional ones in process capability, thereby increasing the production yield of the devices.

6 Claims, 3 Drawing Sheets

METHOD FOR FABRICATING A HALF-TONE TYPE PHASE SHIFT MASK

BACKGROUND OF THE INVENTION

1. Field of the Invention

The present invention relates, in general, to a method for fabricating a phase shift mask, and more particularly, to a method for improving the production cost and yield of the phase shift mask.

2. Description of the Prior Art

A typical photolithography process for a semiconductor device employs a mask comprising a transparent substrate, such as quartz, on which light screen patterns of chrome are formed. However, it is virtually impossible to form photosensitive patterns with a good profile by using the typical chrome mask, in a lesser dimension than can be formed by current light exposing equipments because interference is caused at the narrow distance between the chrome patterns. Indeed, the typical chrome mask is not applied in the fabrication of a semiconductor device of 64M or more.

Various efforts have been made to overcome this problem. In an effort to develop highly integrated semiconductor devices, a phase shift mask comprising a quartz substrate was developed on which a plurality of spaced chrome patterns are formed with a phase shift pattern between the two chrome patterns.

In such phase shift mask, the light passing through the quartz substrate has a phase shifted at an angle of 180° to the light passing through the phase shift patterns. Therefore, the intensity of light shows zero at the interface between the quartz substrate and the phase shift patterns, thereby improving the profile of photosensitive film patterns.

The use of such a phase shift mask in a photolithography process makes the process capability better by 50% or more than the use of conventional chrome masks. In addition, the phase shift mask is capable of forming photosensitive film patterns which are finer than the limit of the light exposing equipments used.

However, the phase shift mask is difficult to design and fabricate, demanding additional equipments. Also, the fabrication of the phase shift mask by prior art methods requires high costs and much time.

SUMMARY OF THE INVENTION

Therefore, an object of the present invention is to overcome the above problems encountered in prior art and to provide methods for the fabrication of a phase shift mask, capable of improving the production cost and yield thereof.

In accordance with an aspect of the present invention, the above object can be accomplished by providing a method comprising the steps of: forming chrome patterns on a transparent substrate; coating a phase shift layer and a negative photosensitive film on the entire area of the resulting structure, in sequence; exposing the photosensitive film to a light incident from the backside of the transparent substrate with the chrome patterns serving as a mask and developing the illuminated area of the photosensitive film, to form photosensitive film patterns; etching the phase shift layer to form phase shift patterns which are each positioned between the chrome patterns, with the photosensitive film patterns serving as a mask; subjecting the chrome patterns to wet etching, to conduct etching at the upper surface and the opposite edges of the chrome patterns so that each of the chrome patterns are spaced from each of the phase shift patterns; and removing the photosensitive film patterns with the transparent substrate exposed through the spaces between the etched chrome patterns and the phase shift patterns.

In accordance with another aspect of the present invention, there is provided a method for the fabrication of a phase shift mask, comprising the steps of: forming chrome patterns distant from each other over a transparent substrate; coating a phase shift layer and a negative photosensitive film over the entire area of the resulting structure, in sequence; exposing the photosensitive film to a light incident from the backside of the transparent substrate for a short time with the chrome patterns serving as a mask; developing the illuminated area of the photosensitive film, to form photosensitive film patterns which are narrower than the distance between the chrome patterns; etching the phase shift layer to form phase shift patterns which are each spaced from each of the chrome patterns with the photosensitive film patterns serving as a mask; and removing the photosensitive film patterns with the transparent substrate exposed through the spaces between the chrome patterns and the phase shift patterns.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1:
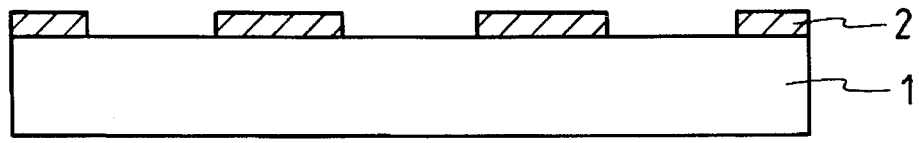
FIGS. 1 through 5 are schematic cross sectional views illustrating a method for the fabrication of a shift phase mask, according to an embodiment of the present invention.

The application of the preferred embodiments of the present invention is best understood with reference to the accompanying drawings, wherein like reference numerals are used for like and corresponding parts, respectively.

FIGS. 1 through 5 show the preferred process steps of a method for the fabrication of a phase shift mask, according to an embodiment of the present invention. These steps will be generally described in connection with the drawings.

First, as shown in FIG. 1, on a quartz substrate 1 are formed chrome patterns 2 in a conventional manner.

Figure 2:
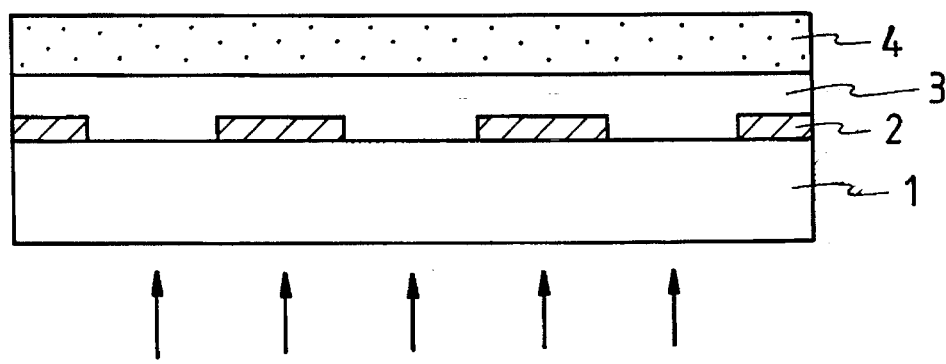

Next, with reference to FIG. 2, a phase shift layer 3 and a negative photosensitive film 4 are coated in sequence over the entire area of the resulting structure of FIG. 1, followed by the exposure of the negative photosensitive film 4 to a light incident from the backside of the quartz substrate 1. The phase shift layer 3 is formed of spin-on-glass (SOG) or chemical vapor deposition oxide.

Figure 3:
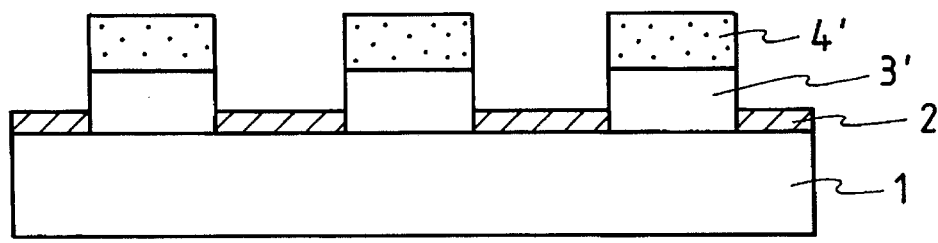
Figure 4:
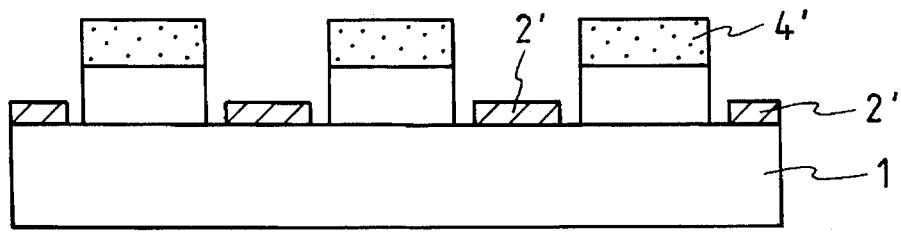

Subsequently, with reference to FIG. 3, the unilluminated areas of the negative photosensitive film 4 are removed by a developing process, to form photosensitive film patterns 4', which are then used as a mask useful in etching the exposed areas of the phase shift layer 3. As a result, phase shift patterns 3' are formed on the area of the transparent substrate 1 on which the chrome patterns are not provided, whereas the areas of phase shift layer over the chrome patterns 2 are eliminated completely. Thereafter, with reference to FIG. 4, the chrome patterns 2 are immersed in a chemical etchant, to conduct etching both at the upper surface of the chrome pattern and at the opposite edges thereof at same time. As a result, chrome patterns 2' with a narrower width are formed, exposing the quartz substrate 1 at the areas of the opposite edges. The degree to which the quartz substrate 1 is exposed at the areas of the opposite edges of the chrome patterns 2 can be controlled by the etching time during which the chrome patterns are etched by the chemical etchant. By reference, the chrome patterns are formed so thick that they may have some thickness after the wet etching.

Figure 5:
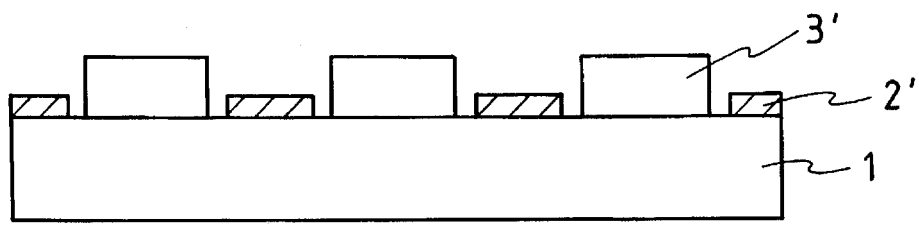

Finally, with reference to FIG. 5, the photosensitive film patterns 4' are removed, to complete the formation of a phase shift mask comprising a plurality of spaced chrome patterns 2' and a plurality of spaced phase shift patterns 3' which are alternately formed distant from each other at a distance on the quartz substrate 1.

FIGS. 6 through 9 show the preferred process steps of a method for the fabrication of a phase shift mask, according to another embodiment of the present invention. These steps will be generally described in connection with the drawings.

Figure 6:
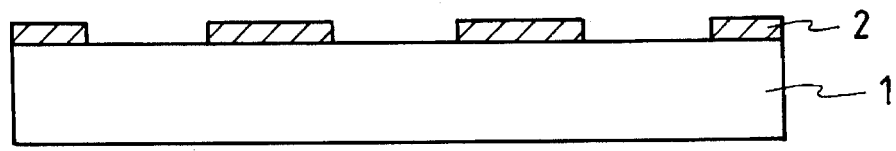
FIGS. 6 through 9 are schematic cross sectional views illustrating a method for the fabrication of a shift phase mask, according to another embodiment of the present invention.

First, as shown in FIG. 6, on a quartz substrate 1 are formed chrome patterns 2 in a conventional manner.

Figure 7:
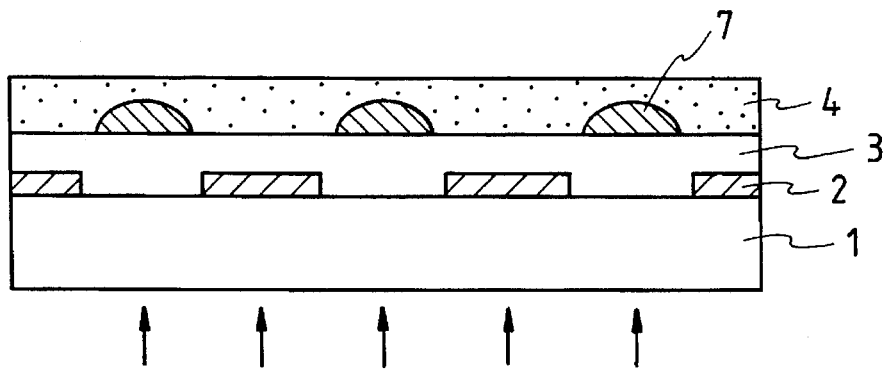

Thereafter, with reference to FIG. 7, a phase shift layer 3 and a negative photosensitive film 4 are coated in sequence over the entire area of the resulting structure of FIG. 5, followed by the exposure of the negative photosensitive film 4 to a light incident from the backside of the quartz substrate 1 for a short time. In this figure, reference numeral 7 denotes the illuminated areas of the negative photosensitive film 4.

Figure 8:
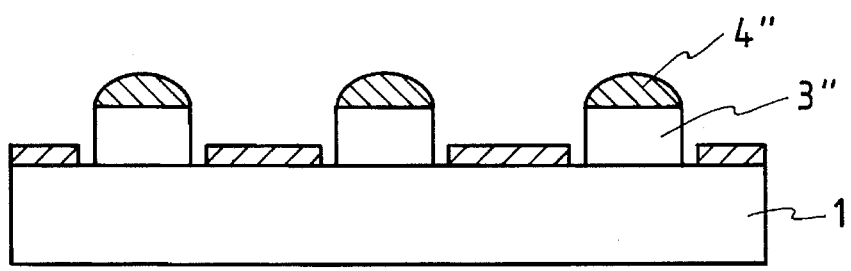

Subsequently, with reference to FIG. 8, the unilluminated areas of the negative photosensitive film 4 are removed by a developing process to form photosensitive film patterns 4", which are then used as a mask useful in etching the exposed areas of the phase shift layer 3. As a result, phase shift patterns 3" are formed on the area of the transparent substrate 1 on which the chrome patterns are not provided, whereas the areas of the phase shift layer over the chrome patterns 2 are eliminated completely. The phase shift patterns 3" which are each positioned between two chrome patterns 2 have a width narrower than the distance between the two chrome patterns 2 because the short illumination time results in the formation of narrower photosensitive film patterns 4" which serves as the mask. Therefore, the quartz substrate 1 is exposed through the spaces between the chrome patterns 2 and the phase shift patterns 4".

Figure 9:
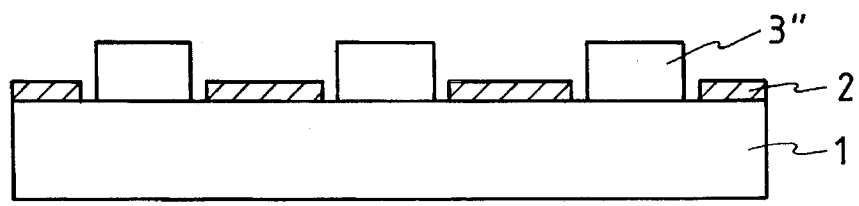

Finally, with reference to FIG. 9, the photosensitive film patterns 4" are removed, to complete the formation of a phase shift mask comprising a plurality of spaced chrome patterns 2 and a plurality of spaced phase shift patterns 3" which are alternately formed distant from each other at a distance on the quartz substrate 1.

As described hereinbefore, the present invention utilizes a conventional chrome mask, so that particular equipments and additional design are not necessary while the production cost is reduced. In addition, the method according to the present invention is superior to conventional ones in process capability, allowing an increase in the production yield of a semiconductor device.

Other features, advantages and embodiments of the invention disclosed herein will be readily apparent to those exercising ordinary skill after reading the foregoing disclosures. In this regard, while specific embodiments of the invention have been described in considerable detail, varia- tions and modifications of these embodiments can be effected without departing from the spirit and scope of the invention as described and claimed.

What is claimed is:

1. A method for the fabrication of a phase shift mask, comprising the steps of:

forming chrome patterns on a transparent substrate;

coating a phase shift layer and a negative photosensitive film on the entire area of the resulting structure, in sequence;

exposing the photosensitive film to a light incident from the backside of the transparent substrate with the chrome patterns serving as a mask and developing the photosensitive film, to form photosensitive film patterns on the phase shift layer;

etching the phase shift layer to form phase shift patterns which are each positioned between the chrome patterns, with the photosensitive film patterns serving as a mask;

subjecting the chrome patterns to wet etching, to conduct etching at the upper surface and the opposite edges of the chrome patterns so that each of the chrome patterns are spaced from each of the phase shift patterns; and removing the photosensitive film patterns, whereby a portion of the transparent substrate is exposed through the spaces between the etched chrome patterns and the phase shift patterns.

2. A method in accordance with claim 1, wherein said chrome patterns are formed so thick that they can sufficiently screen light after said wet etching.

3. A method according to claim 1, wherein the chrome patterns are formed directly onto the transparent substrate.

4. A method according to claim 3, wherein the transparent substrate forms a lowermost base layer of the phase shift mask.

5. A method for the fabrication of a phase shift mask, comprising the steps of:

forming chrome patterns distant from each other over a transparent substrate;

coating a phase shift layer and a negative photosensitive film over the entire area of the resulting structure, in sequence;

exposing the photosensitive film to a light incident from the backside of the transparent substrate for a short time to expose only a portion of the photosensitive film in the exposure region, with the chrome patterns serving as a mask;

developing the illuminated area of the photosensitive film, to form phase shift layer and photosensive film patterns which are narrower than the distance between the chrome patterns;

etching the phase shift layer to form phase shift patterns which are each spaced from each of the chrome patterns with the photosensitive film patterns serving as a mask; and removing the photosensitive film patterns whereby a portion of the transparent substrate is exposed through the spaces between the chrome patterns and the phase shift patterns.

6. A method according to claim 5, wherein the transparent substrate comprises a lowermost layer and wherein the chrome patterns are formed directly on the transparent substrate.

* * * * *